United States Patent [19]
Sandhu et al.

[11] Patent Number: 5,824,365
[45] Date of Patent: Oct. 20, 1998

[54] METHOD OF INHIBITING DEPOSITION OF MATERIAL ON AN INTERNAL WALL OF A CHEMICAL VAPOR DEPOSITION REACTOR

[75] Inventors: Gurtej S. Sandhu; Ravi Iyer; Donald L. Westmoreland, all of Boise, Id.

[73] Assignee: Micron Technology, Inc., Boise, Id.

[21] Appl. No.: 668,855

[22] Filed: Jun. 24, 1996

[51] Int. Cl.⁶ .............................. B05D 7/22; C23C 16/00
[52] U.S. Cl. ..................... 427/239; 427/237; 427/238; 427/250; 427/248.1
[58] Field of Search .................................. 427/237, 239, 427/238, 248.1, 250; 438/905

[56] References Cited

U.S. PATENT DOCUMENTS

| | | | |
|---|---|---|---|
| 4,650,698 | 3/1987 | Moriya et al. | 427/237 |
| 5,366,585 | 11/1994 | Robertson et al. | 156/643 |
| 5,589,233 | 12/1996 | Law et al. | 427/579 |

FOREIGN PATENT DOCUMENTS 60-10621  1/1985  Japan .

*Primary Examiner*—Roy V. King
*Attorney, Agent, or Firm*—Wells, St. John, Roberts, Gregory & Matkin, P.S.

[57] ABSTRACT

A method of inhibiting deposition of material on a wall of a chemical vapor deposition reactor includes providing a chemical vapor deposition reactor having a wall which has an inside facing surface, the inside facing surface at least partially defining a chemical vapor deposition reactor chamber; forming a first material atop the inside facing surface; positioning a substrate in the chemical vapor deposition reactor chamber, the substrate having an outer surface; and chemical vapor depositing a second material layer on the substrate in a manner which is selective to the substrate outer surface, and not the first material, thereby restricting deposition of the second layer on the reactor inside facing surface.

2 Claims, 4 Drawing Sheets

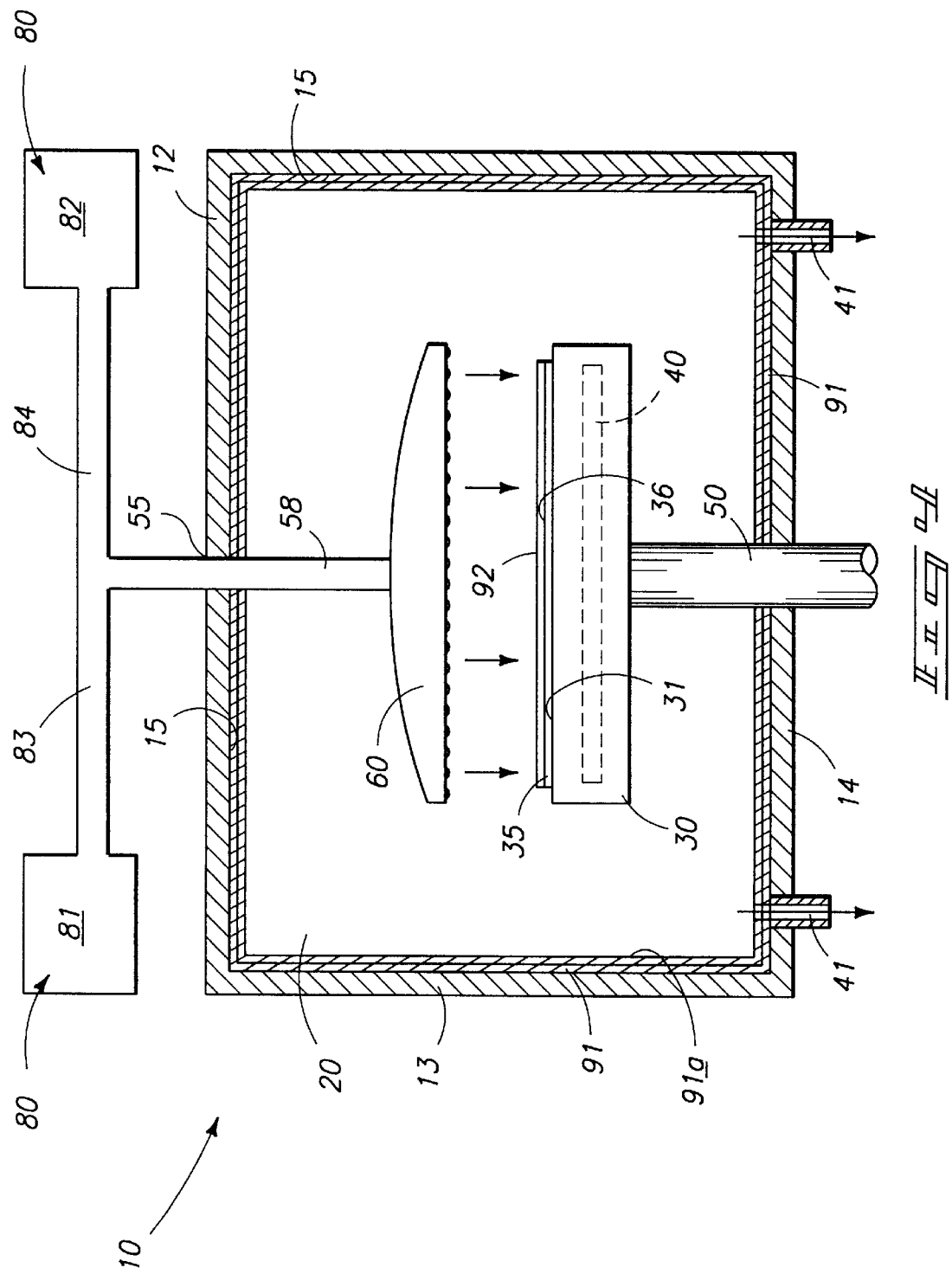

METHOD OF INHIBITING DEPOSITION OF MATERIAL ON AN INTERNAL WALL OF A CHEMICAL VAPOR DEPOSITION REACTOR

TECHNICAL FIELD

This invention concerns methods of inhibiting deposition of material on the walls of a chemical vapor deposition reactor, and a chemical vapor deposition reactor which resists the deposit of materials on the walls thereof.

BACKGROUND OF THE INVENTION

Chemical vapor deposition systems are divided into two primary types, namely, atmospheric pressure, and low pressure. Within each type, a system may be either cold wall or hot wall. Cold wall systems use induction or radiant heating to directly heat the wafer holders or wafers as they pass through a quartz reaction chamber. Hot wall types of reactors supply the reaction energy by a method that heats the wafers, the wafer holder and the chamber walls.

The advantage of cold wall chemical vapor deposition is that the reaction substantially occurs only at the heated wafer holder. On the other hand, in a hot wall system, the chemical reaction occurs throughout the reaction chamber having a greater tendency to leave reaction products and by-products on the inside chamber walls. In this regard, the reaction products build up on the reactor walls thereby necessitating rigorous and frequent cleaning to prevent contamination of the wafers being processed. This reactor cleaning step, and subsequent contamination control measures, reduces the throughput of the chemical vapor deposit reactor and therefore increases the manufacturing costs attendant to semiconductor devices produced by this manufacturing method. In still other systems, a plasma field is created in the reaction chamber to enhance film deposition. The plasma field provides additional energy to the chemical reaction thus resulting in more uniform depositions and/or lower reaction temperatures. These assemblies are called plasma enhanced chemical vapor deposition systems.

A method of inhibiting the deposition of material on an internal wall of a chemical vapor deposition reactor is the subject matter of the present application.

BRIEF DESCRIPTION OF THE DRAWINGS

FIG. 4 is a view of the FIG. 2 chemical vapor deposition reactor at a processing step subsequent to that shown in FIG. 2.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the present invention, a method of inhibiting deposition of material on an internal wall of a chemical vapor deposition reactor comprises the following steps:

providing a chemical vapor deposition reactor having a wall and which has an inside facing surface, the inside facing surface at least partially defining a chemical vapor deposition reactor chamber;

forming a first material layer atop the inside facing surface;

positioning a substrate in the chemical vapor deposition reactor chamber, the substrate having an outer surface; and chemical vapor depositing a second material layer on the substrate a manner which is selective to the substrate outer surface, and not the first material, thereby restricting deposition of the second layer on the reactor inside facing surface.

Still a further aspect of the present invention relates to a chemical vapor deposition method which comprises the following steps:

providing a chemical vapor deposition reactor having a wall which has an electrically conductive inside facing surface, the inside facing surface at least partially defining a chemical vapor deposition reactor chamber;

rendering the inside facing surface substantially electrically insulative;

positioning a substrate having an outer electrically conductive surface in the chemical vapor deposition reactor chamber; and chemical vapor depositing a layer of material on the substrate in a manner which is selective to electrically conductive surfaces and thereby restricting deposition of the layer of material on the reactor inside facing surface.

Still a further aspect of the present invention relates to a chemical vapor deposition reactor for processing a substrate which has an outer surface, comprising;

a wall having an inside facing surface and which at least partially defines a chemical vapor deposition reactor chamber;

a first material layer on the inside facing surface of the wall; and a second material layer on the substrate wafer outer surface, the second material layer formed in a manner which is selective to the substrate wafer outer surface, and not the first material layer thereby restricting formation of the second material layer on the inside facing surface of the chemical vapor deposition reactor.

Figure 1:
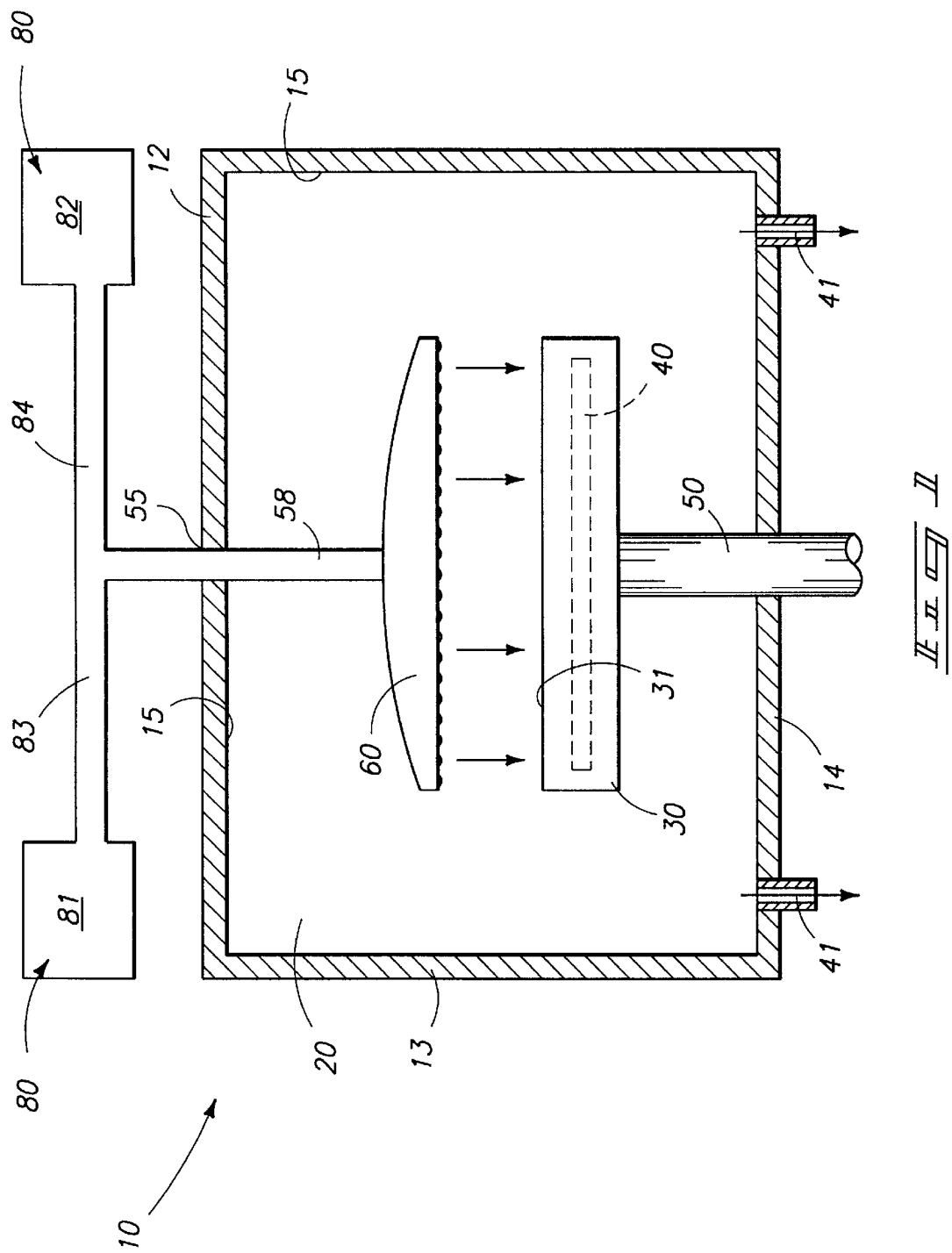
FIG. 1 is a partial, vertical, cross sectional view taken through a chemical vapor deposition reactor.

Referring now to FIG. 1, one typical prior art chemical vapor deposition reactor is shown generally by the numeral 10. As illustrated, the chemical vapor deposition reactor 10 has a top surface 12, and a substantially continuous sidewall 13 which is made integral therewith. Further, the chemical vapor deposition reactor has a bottom portion 14. The top surface 12, and continuous sidewall 13, each have an inside facing surface 15 which defines the reactor chamber 20.

As further seen in FIG. 1, the chemical vapor deposition reactor 10 has a platen which is generally indicated by the numeral 30. In particular, the platen 30 includes a top surface 31 which supports a semiconductor wafer 35 to be processed.

Figure 2:
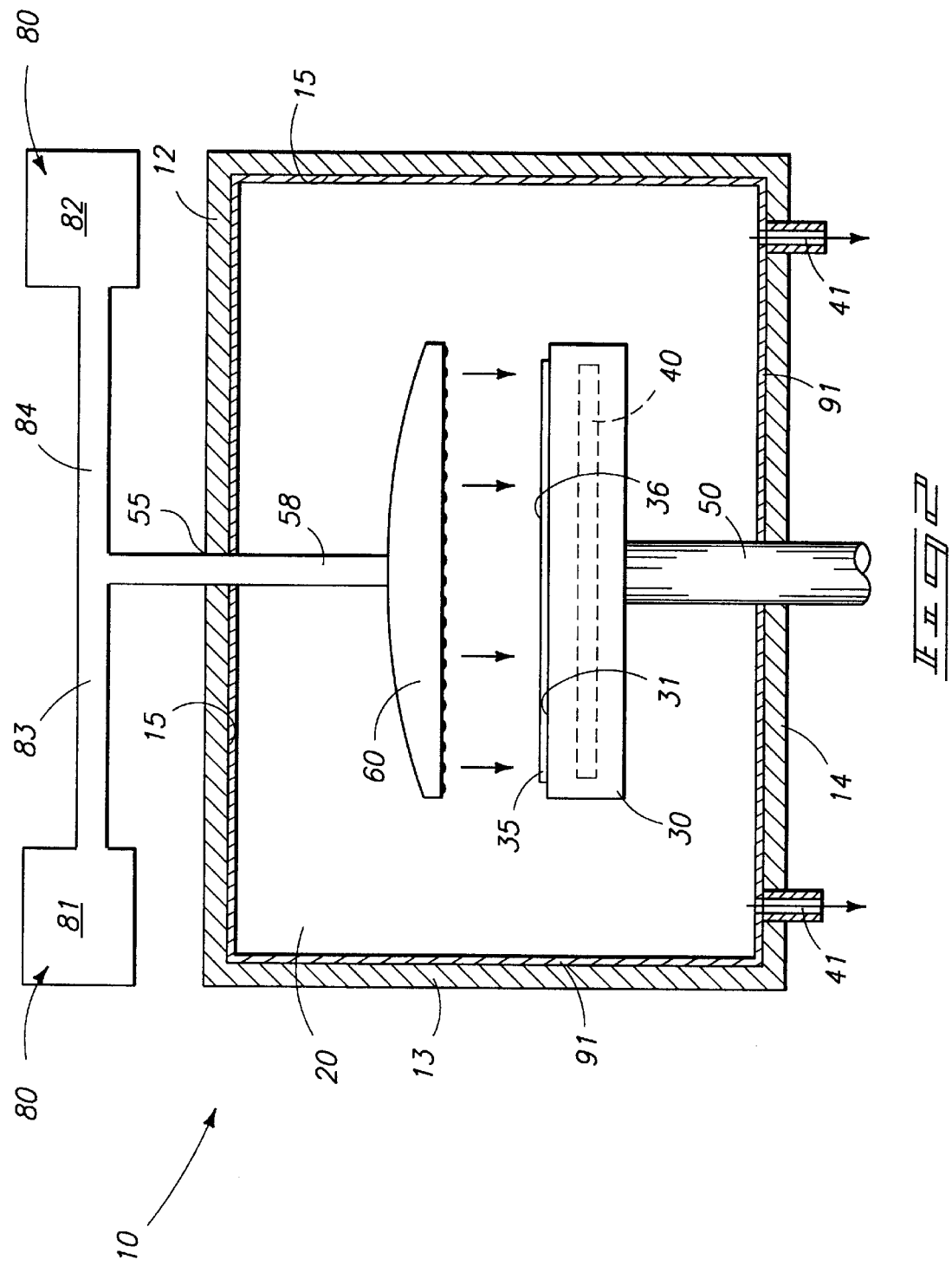
FIG. 2 is a view of the FIG. 1 chemical vapor deposition reactor at a processing step subsequent to that shown in FIG. 1.

A heater 40 is mounted in heat transferring relationship relative to the top surface 31 of the platen 30. The heater 40 transmits heat energy to the reactor chamber 20, and in particular, to the in-process substrate or semiconductor wafer 35, as will be discussed below. Apertures 41 are formed in the bottom portion 14 and provide a means by which a vacuum may be drawn by a pump, (not shown) to establish a given low pressure environment in the reactor chamber 20. The platen is supported in a given position in the chemical vapor deposition reactor chamber 20 by a shaft 50. An aperture 55 is formed in the top surface 12 of the chemical vapor deposition reactor 10. The aperture receives a conduit 58 which mounts a shower head 60 at the distal end thereof as best seen in FIG. 2. The shower head 60 supplies a source of gaseous materials to the chemical vapor deposition reactor chamber 20, and the top surface 36, of the semiconductor wafer 35.

The sources of gaseous material 80 include a first material 81 and a second material 82. The first material 81 is connected in fluid flowing relation to the reactor chamber 20 by means of a first conduit 83 and conduit 58. Further, a second conduit 84, and conduit 58, connect the source of the second material 82 to the reactor chamber 20. The gaseous materials travel into the reactor chamber 20 where such gases are provided by means of the shower head 60 to the top surface 36 of the semiconductor wafer 35, at least some portion of which is electrically conductive.

Referring now to FIG. 2, the method of the present invention which inhibits the deposition of material on an internal wall 13 of the chemical vapor deposition reactor 10 includes, as a first step, providing a chemical vapor deposition reactor 10 having a wall 13 which has an inside facing surface 15. The inside facing surface 15 at least partially defines a chemical vapor deposition reactor chamber 20. The chemical vapor deposition reactor sidewall 13 is typically manufactured from an electrically conductive material such as aluminum or the like. The method of the present invention further includes, as a second step, forming a first electrically insulative material layer 91 atop the inside facing surface 15. The first material layer 91 can be formed by a chemical vapor deposition reaction using one or more source gases provided through one or both of the conduits 83, 84 and 58. The first material layer 91 preferably comprises an electrically insulative material, such as an oxide or nitride. Most preferably, materials such as silicon nitride and aluminum oxide are deposited. The first material layer can also be grown, for example, by flowing $O_2$ into a chamber having aluminum walls. Under these circumstances, the $O_2$ converts the chamber surface to $Al_2O_3$. Thereafter, a substrate or semiconductor wafer 35 is positioned in the chemical vapor deposition reactor chamber 20.

Figure 3:
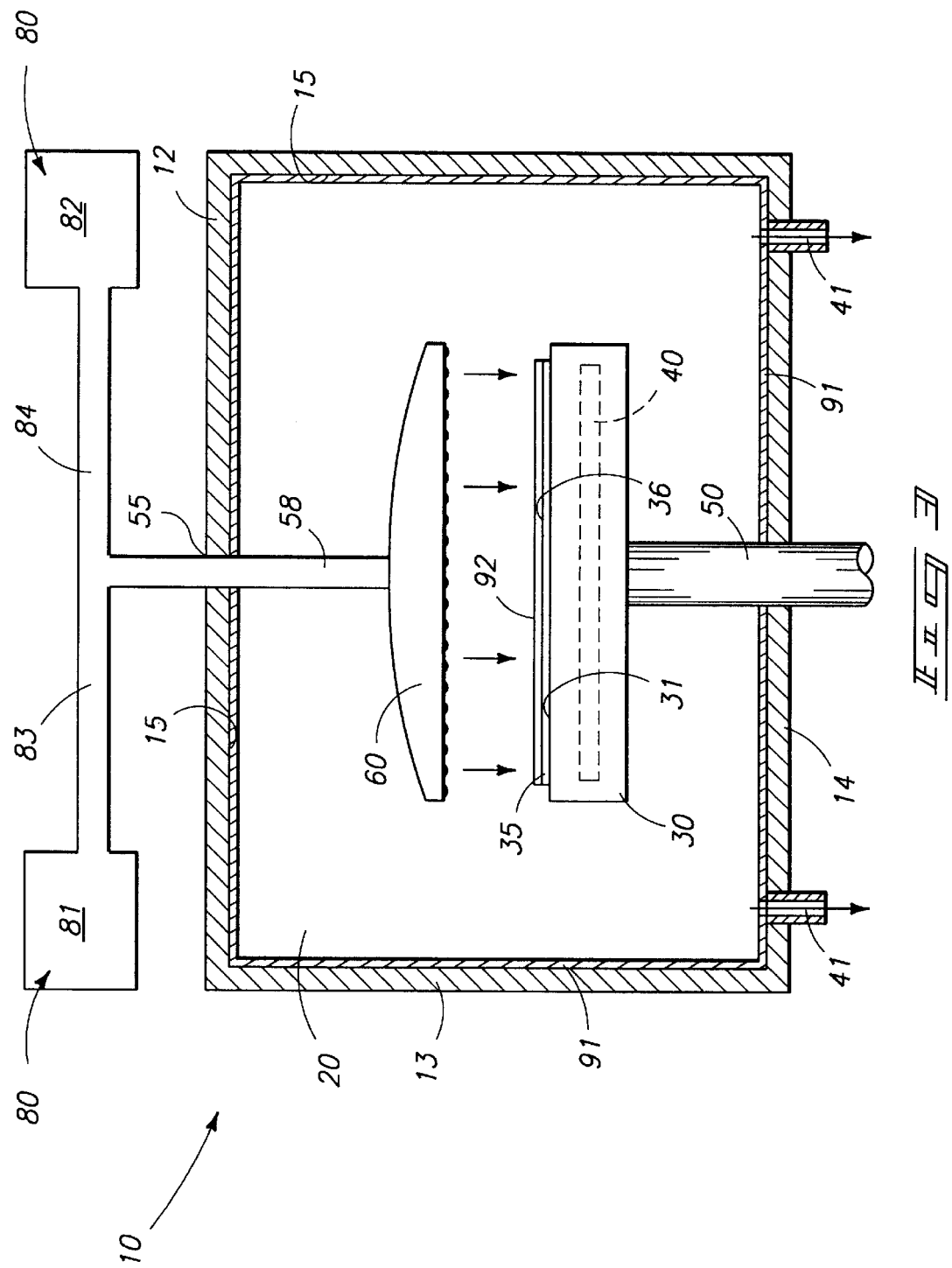
FIG. 3 is a view of the FIG. 2 chemical vapor deposition reactor at a processing step subsequent to that shown in FIG. 2.

Referring now to FIG. 3, after positioning the substrate or semiconductor wafer 35 in the chemical vapor deposition reactor chamber 20, and after forming the first material layer 91 atop the inside facing surface 15, a second material layer 92 is chemical vapor deposited on the substrate or semiconductor wafer 35 in a manner which is selective to the substrate outer surface 36, and not the first material layer 91. This restricts or substantially inhibits deposition of the second layer 92 on the reactor inside facing surface 15. Examples of preferred second materials are selected from the group of materials consisting of aluminum, titanium, tungsten, and conductive compounds of aluminum, titanium, tungsten or mixtures thereof. In this fashion, the method of the present invention substantially reduces the detriments of the prior art practices which often result in significant deposits of undesirable materials on the inside facing surface 15 of the chemical vapor deposition reactor chamber 20.

As earlier discussed, where a chemical vapor deposition reactor chamber 20 has an aluminum sidewall 13, the first layer of material 91 can be provided in the form of aluminum oxide by feeding oxygen to the reactor chamber 20. Temperature and pressure conditions effective to cause a reaction to form the aluminum oxide are provided inside the reactor chamber 20. Such reaction conditions include, for example, a temperature of greater than about 20 degrees C and a pressure range of about 0.1 to about 760 Torr. Plasma will further speed the deposit of this same electrically insulative layer. A preferred first layer 91 of aluminum oxide is provided to a thickness of from about 10 to about 50 Angstroms.

Further, as an example, where the second material layer 92 comprises aluminum, a suitable precursor source gas comprises dimethyl aluminum hydride(DMAH). An example process which will selectively deposit aluminum on the conductive portions of the surface 61 but not on the aluminum oxide layer 91, or other insulative surfaces, include a temperature of about 100 degrees C. to about 500 degrees C., and a pressure of from about 0.1 Torr to about 100 Torr. Hydrogen gas might also optionally be combined with the DMAH and facilitate reduction of carbon incorporation in the deposited film.

The above example process is expected to be substantially selective such that essentially none, or up to no more than about 30%, of the deposited material 92, occurs on electrically insulated surfaces within the reactor chamber. Accordingly, deposition of undesired material on the chemical vapor deposition reactor sidewalls 12, 13, and 14, can be substantially reduced or effectively eliminated.

It is possible that the treated sidewalls 12, 13, and 14, having a layer 91, will not completely passivate or insulate the sidewall 13 such that small portions of conductive material of the inner sidewalls may be exposed. Further where the second material 92 is electrically conductive, a small quantity of such material 92 may deposit on the reactor exposed surface if the deposition is not 100% selective to electrically conductive surfaces 36. Any such areas may undesirably function as seed locations for even more of the conductive second material 92 to selectively deposit thereon during the chemical vapor depositions.

Referring now to FIG. 4, the most preferred process in accordance with the present invention is to successively apply first material layers 91 to selected thicknesses on the inside facing surface 15 of the internal walls 12, 13, and 14, between discrete second material layer depositions 92. Such is exemplified in FIG. 4, wherein two layers 91 and 91A are shown as being successively deposited. Such successive depositions of 91 and 91A might occur after each second material layer 92 deposition process for a given set of semiconductor wafer 35 within the chemical vapor deposition reactor 10, or after a plurality of sets of wafers 35 have been provided with deposited second material layers 92.

The above preferred process shows but one method of rendering at least one inside facing surface 15 of a chemical vapor deposition reactor 10 electrically insulative for avoiding deposition of a second material layer 92 on reactor sidewall surfaces 15, where the second material layer 92 deposition is conducted in a manner highly selective to electrically conductive surfaces 36. Other techniques might also of course be utilized to render such internal surface(s) electrically insulative.

Further, the invention has applicability to substantially selective chemical vapor deposition processes not necessarily achieving selectivity based upon the conductive nature of the surface upon which a material is being deposited. For example, a first material may be initially provided over an inside facing surface 15 of a chemical vapor deposition reactor 20. A second material might thereafter be deposited over the semiconductor wafer in a manner which is substantially selective to the semiconductor wafer outer surface and not the first material. The deposition of the second material layer is thereby restricted onto the first material or reactor inside facing surface, and accordingly independent of the conductive nature of the material or surfaces.

In compliance with the statute, the invention has been described in language more or less specific as to structural and methodical features. It is to be understood, however, that the invention is not limited to the specific features shown and described since the means herein disclosed comprise preferred forms of putting the invention into effect. The invention is, therefore, claimed in any of its forms or modifications within the proper scope of the appended claims appropriately interpreted in accordance with the Doctrine of Equivalents.

We claim:

1. A method of inhibiting deposition of material on an internal wall of a chemical vapor deposition reactor, comprising:

providing a chemical vapor deposition reactor having a wall which has an inside facing surface, and wherein the inside facing surface of the chemical vapor deposition chamber reactor wall comprises an electrically conductive metallic material, and wherein the inside facing surface at least partially defines a chemical vapor deposition reactor chamber;

forming a first electrically insulative material layer comprising silicon nitride immediately against the inside facing surface of the chemical vapor deposition reactor chamber before loading a substrate to be processed into the chemical vapor deposition reactor chamber, and wherein the first material layer has a thickness of about 10 to about 50 Angstroms;

after forming the first material layer, positioning the substrate in the chemical vapor deposition reactor chamber, the substrate having an outer surface; and chemical vapor depositing a second material layer on the substrate; the second material layer being selected from the group consisting essentially of aluminum, titanium, tungsten, and compounds of aluminum, titanium, tungsten and mixtures thereof, the chemical vapor depositing of the second material layer being performed in a manner which is selective to the substrate outer surface and not the first material layer of silicon nitride, thereby restricting deposition of the second layer on the reactor inside facing surface, and wherein the first and second material layers are different.

2. A method of inhibiting deposition of material on an internal wall of a chemical vapor deposition reactor, comprising:

providing a chemical vapor deposition reactor having a wall which has a metallic inside facing surface, the inside facing surface at least partially defining a chemical vapor deposition reactor chamber, and wherein the inside facing surface of the chemical vapor deposition reactor wall is electrically conductive;

forming a first material layer atop the inside facing surface of the chemical vapor deposition reactor chamber before loading a substrate to be processed into the chemical vapor deposition reactor chamber, and wherein the first material layer comprises an electrically insulative metallic oxide, and wherein the step of forming the first material layer consumes the metallic inside facing surface, and wherein the first material layer has a thickness of about 10 to about 50 Angstroms;

after forming the first material layer, positioning the substrate in the chemical vapor deposition reactor chamber, the substrate having an outer surface; and after positioning the substrate in the chemical vapor deposition reactor chamber, chemical vapor depositing a second material layer on the substrate, and wherein the second material layer is selected from the group consisting essentially of aluminum, titanium, tungsten, and compounds of aluminum, titanium, tungsten and mixtures thereof, and wherein the depositing manner of the second material layer is selective to the outer surface of the substrate, and not the first material layer thereby restricting deposition of the second layer on the reactor metallic inside facing surface, and wherein the first and second material layers are different.

* * * * *